United States Patent [19]

Bottka

[11] 4,218,143
[45] Aug. 19, 1980

[54] LATTICE MATCHING MEASUREMENT DEVICE

[75] Inventor: Nicholas Bottka, Caracas, Venezuela

[73] Assignee: The United States of America as represented by the Secretary of the Navy, Washington, D.C.

[21] Appl. No.: 5,256

[22] Filed: Jan. 22, 1979

[51] Int. Cl.$^3$ .................. G01N 21/55; H01L 27/14
[52] U.S. Cl. .................. 356/445; 250/571; 357/30
[58] Field of Search ............... 357/15, 16, 30; 250/571; 356/445, 446, 447, 448

[56] References Cited

U.S. PATENT DOCUMENTS

| | | | |
|---|---|---|---|
| 3,296,523 | 1/1967 | Haas | 324/57 |
| 3,623,818 | 12/1969 | Gardner et al. | 356/445 |
| 3,748,579 | 7/1973 | Henry | 324/158 |
| 3,905,836 | 9/1975 | Epple | 148/1.5 |
| 3,939,415 | 2/1976 | Terasawa | 324/158 D |
| 3,943,442 | 3/1976 | Fletcher et al. | 324/158 R |
| 3,982,261 | 9/1976 | Antypas | 357/16 |
| 3,995,216 | 10/1976 | Yun | 324/158 |
| 4,045,749 | 8/1977 | Burnham et al. | 331/94.5 H |
| 4,053,918 | 10/1977 | Fletcher et al. | 357/30 |

*Primary Examiner*—John K. Corbin
*Assistant Examiner*—Rodney B. Bovernick
*Attorney, Agent, or Firm*—R. S. Sciascia; W. Thom Skeer; Kenneth G. Pritchard

[57] ABSTRACT

A method of and apparatus for measuring lattice mismatch in a thin multilayer semiconductor. By changing the voltage potential across a semiconductor, the different energy gaps present will absorb different frequencies of light. By shining monochromatic light of the frequency in question, a detector can observe the presence of such energy gaps by the absorption of the instant light intensity that will occur. The use of a Schottky barrier permits the light to be reflected back through the device a second time to maximize the absorption characteristics of energy gaps which may be present. Use of a substrate with known energy gaps permits broad band light to be scanned to determine the spectral components absorbed at each of the known energy gaps within the semiconductor.

20 Claims, 4 Drawing Figures

LATTICE MATCHING MEASUREMENT DEVICE

BACKGROUND OF THE INVENTION

1. Description of the prior art

Previous measurements of lattice matching thin multilayered semiconductors required microcleaving or microprobing to measure the energy gaps formed between the layers. Use of microcleaving destroys the semiconductor device for future use. A microprobe will give the composition of the layer but requires an elaborate calibration procedure.

2. Field of the invention

This invention pertains to devices for measuring energy gaps of thin multilayered semiconductor devices. In particular it pertains to an apparatus and method which permit nondestructive testing of thin multilayered semiconductors to determine the lattice matching of such devices.

This invention also pertains to a device which can serve as a light spectrum analyzer for photon energies corresponding to the gap energies of the multilayers. There will be a direct correlation between the light modulated signal at a given wavelength and the applied DC bias on the device.

SUMMARY OF THE INVENTION

The measurement of the lattice matching of a multilayered semiconductor is performed by first placing electrodes on the bottom substrate and uppermost layer of the semiconductor to be tested. The electrode on the uppermost layer will be a thin metal film which will be a Schottky barrier contact. The electrodes are connected to a variable DC voltage biasing source and an AC voltage in series with it. Monochromatic light is shone into the semiconductor through the largest energy-gap substrate side such that the light passes through the layers, is reflected at the Schottky barrier contact and emerges back out of the semiconductor. The reflected light is then measured by a detector which compares the intensity of the light at the positive and negative excursions of the AC voltage across the semiconductor. The DC bias voltage will determine the depletion depth of the electric field in the semiconductor. Depending upon its value, it will permit a different band gap to undergo electro-absorption of the incident light. When an energy gap corresponding to that of the wavelength of the incoming light occurs, the semiconductor will absorb light and reduce the intensity periodically with the AC modulating voltage. By changing the voltage selectively, each energy gap between succeeding layers can be made to absorb energy and thus identify the energy gap present.

This same principle can be used to create a spectrum analyzer when incident light of unknown wavelengths is present. In this case, the multilayered semiconductor will have known energy gaps. As the voltage across these energy gaps permits an electric field induced absorption at each gap, the intensity of the light will be reduced due to absorption of that particular frequency. The detector, now noting a periodic loss of light intensity, can be correlated to the voltage that is being used to bias the device to determine which light frequencies are being absorbed.

DESCRIPTION OF THE PREFERRED EMBODIMENT

Figure 1:
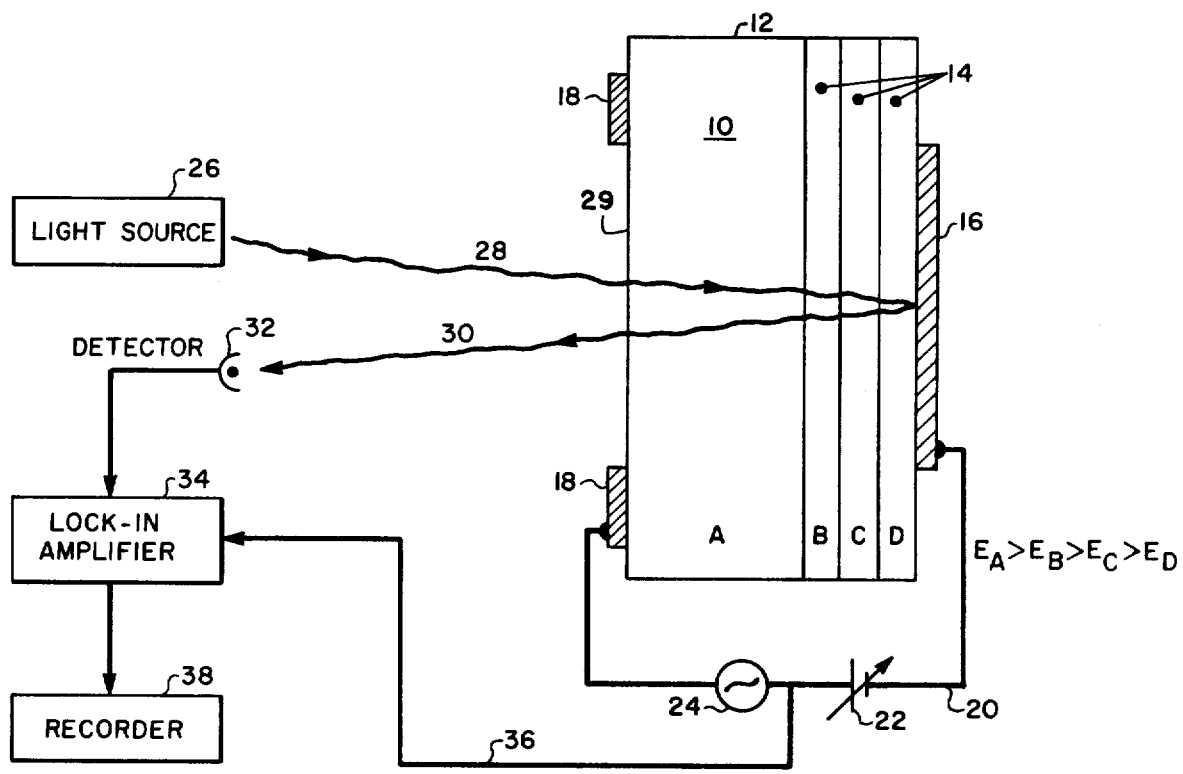
FIG. 1 shows a schematic of the present invention.

In FIG. 1, a substrate 10 of semiconductor 12 has epitaxial layers 14 grown on it. For purposes of example, substrate 10 can be made of N+ GaAs while epitaxial layers 14 are composed of N type $GaAs_{1-x}Sb_x$ where X equals the atomic percentage of Sb normalized to the number of As atoms. The use of gallium, arsenic and antimony are exemplary for building a device which is responsive in the visual and near infrared energy region. Placed on the top surface of epitaxial layers 14 is a Schottky barrier contact 16. Placed on the bottom of substrate 10 are ohmic electrodes 18 which are connected to Schottky barrier contact 16 via circuitry 20 which is composed of a variable voltage source 22 and a frequency oscillator 24. Substrate 10 and eiptaxial layers 14 can be further thought of as a sequence of layers A, B, C, and D as marked. The use of four layers is for example only as any number can be used provided that the layers are thin and of such a composition that they can be depleted of carriers. To provide uniformity in the device, as will be clear from further discussion, the energy-gaps of these layers are in increasing order as one goes from Schottky barrier contact 16 towards electrodes 18. In other words, the gap energy of layer A is greater than the potential of layer B, which is greater than the potential of layer C, which in turn is greater than the potential of layer D.

As each layer is epitaxially grown on a previous layer, a typical energy gap pattern which is a characteristic of the smoothness of transition of composition between layers is created. The electroabsorption of light shining through such a semiconductor will occur only in the layer sustaining an electric field. By back biasing the semiconductor through a series of voltages an electric field can be applied to successive layers. The AC voltage superimposed on the DC bias allows the corresponding absorption edges to be field modulated. This will result in a light intensity modulation at each light frequency corresponding to the gap-energy of the layer sustaining part of the applied electric field.

To observe whether such absorptions take place, a source of monochromatic light 26 providing light of intensity I is arranged so that the light is incident on the substrate side of semiconductor 12. Light source 26 provides light as shown by arrow 28 which is transmitted through semiconductor 12. The light reflects off of Schottky barrier contact 16 and is emitted as reflected light 30. An antireflection coating 29 can be applied to the bottom of substrate 10 to maximize the amount of light transmitted through semiconductor 12. With no applied potential, semiconductor 12 is transparent to monochromatic light 28 and the intensity of reflected light 30 is identical to that of instant light 28. Reflected light 30 is intercepted by detector 32 which measures an intensity of light equal to the incident light intensity I plus the absorbed intensity ΔI. If absorption occurs, ΔI will always be a negative quantity. Detector 32 can be any of the traditional detectors such as a silicon detector which receives light and converts it into an electrical quantity such as current. The current is a function of the intensity received. The output of detector 32 is fed to an amplifier 34 which can be a lock-in amplifier to facilitate ease in measurement of the change in intensity I. The use of a lock-in amplifier permits detector 32 output to be phase locked to a reference signal 36 from oscillator 24. Oscillator 24 provides a change in voltage to the bias voltage present such that there is a continuous sampling back and forth of incident light intensity I, when no absorption occurs, and reflected light intensity I+ΔI when absorption is ocurring. This amplified output of detector 32 is then inputed to a recorder 38 which can be a simple X-Y recorder to provide a graph or chart showing the correspondence between reflected light intensity 30 and the voltage from voltage source 22.

Figure 2:
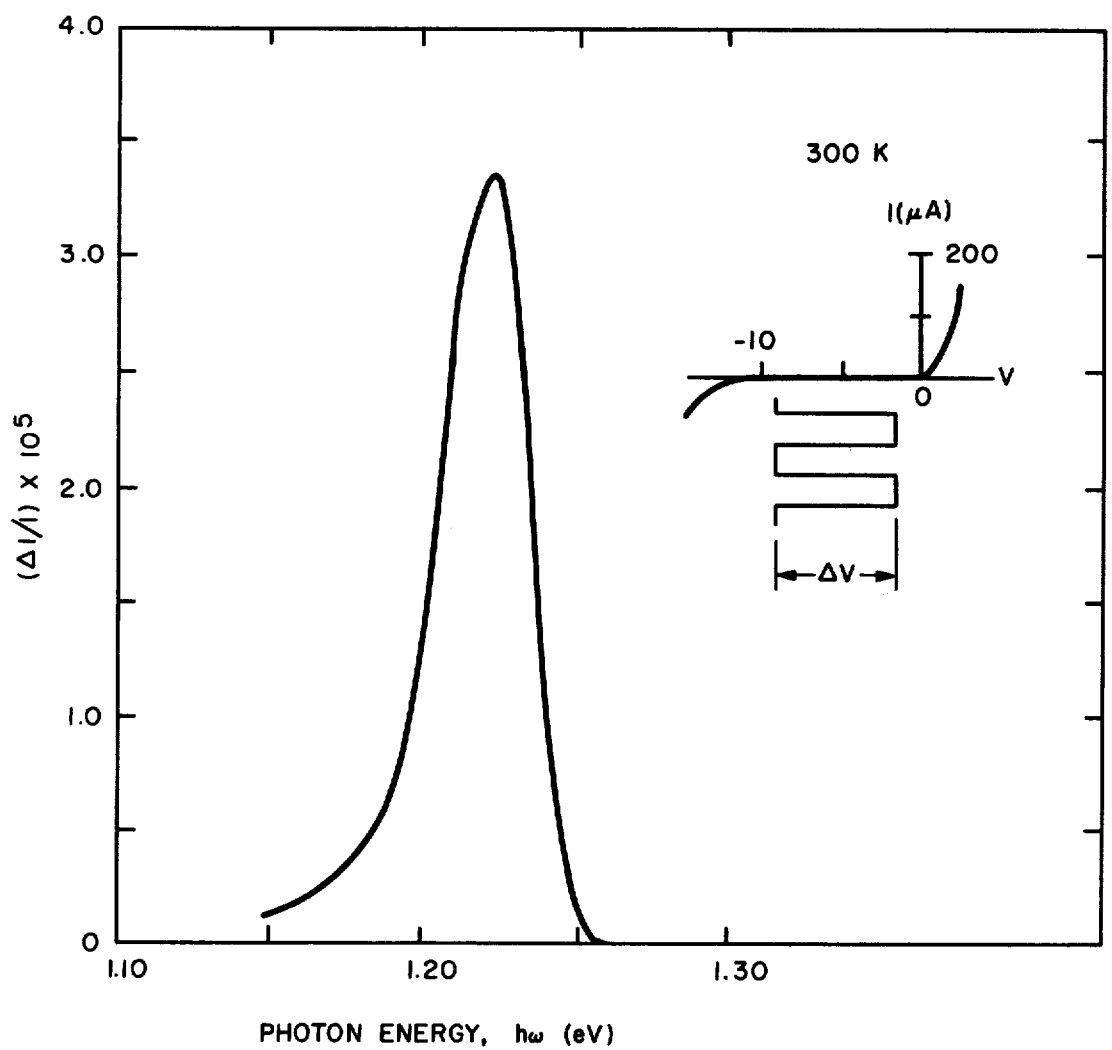
FIG. 2 is a graph of field modulation vs photon energy at an interface between the metal contact and the first layer of a multilayered semiconductor.

FIG. 2 shows a sample graph of the effect of electroabsorption in the first layer adjacent to the Schottky contact. The quantity ΔI/I times an appropriate multiplier is plotted against the actual photon energy being absorbed. The insert in FIG. 2 is an example of the change in voltage ΔV being applied by oscillator 24 superimposed on the current-voltage characteristics of the semiconductor device.

Figure 3:
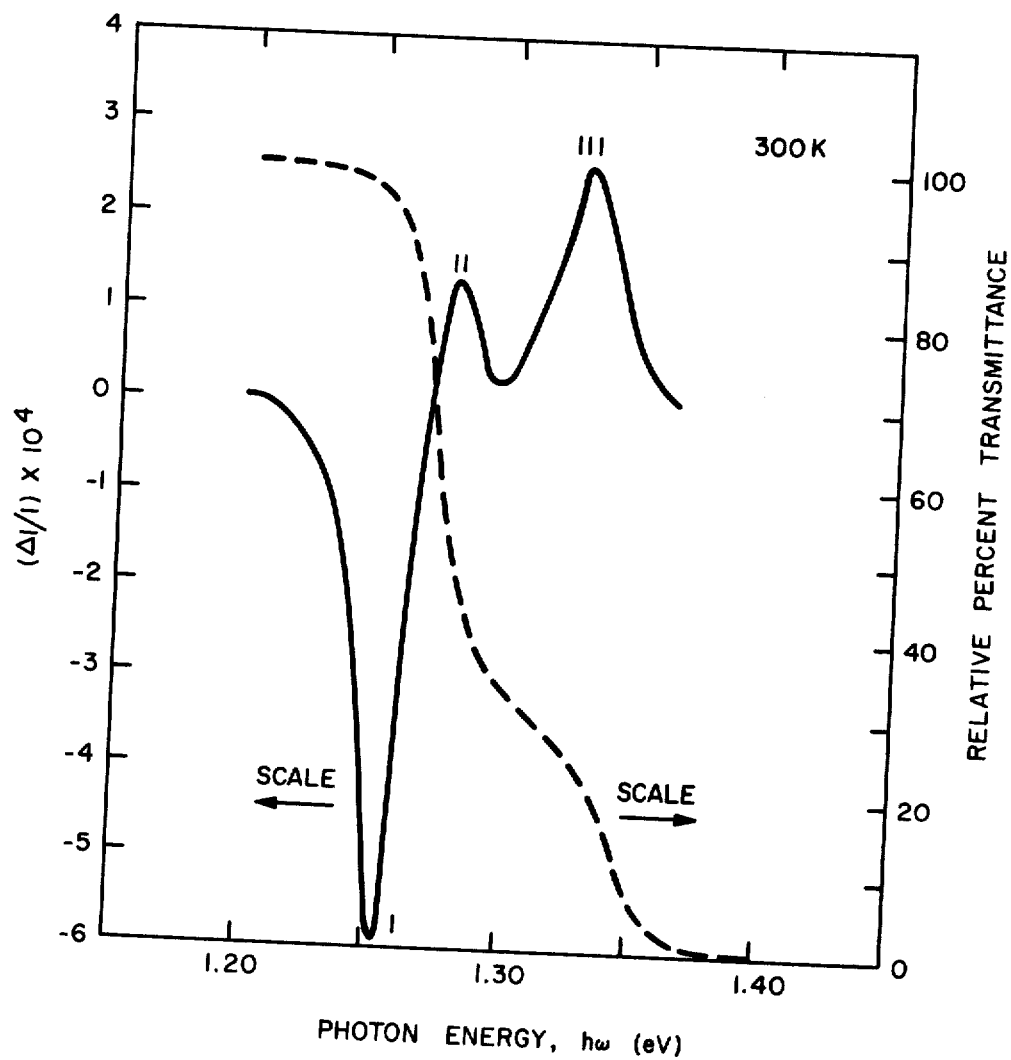
FIG. 3 is a graph of the intensity modulation vs photon energy for a two layered semiconductor device.
Figure 4:
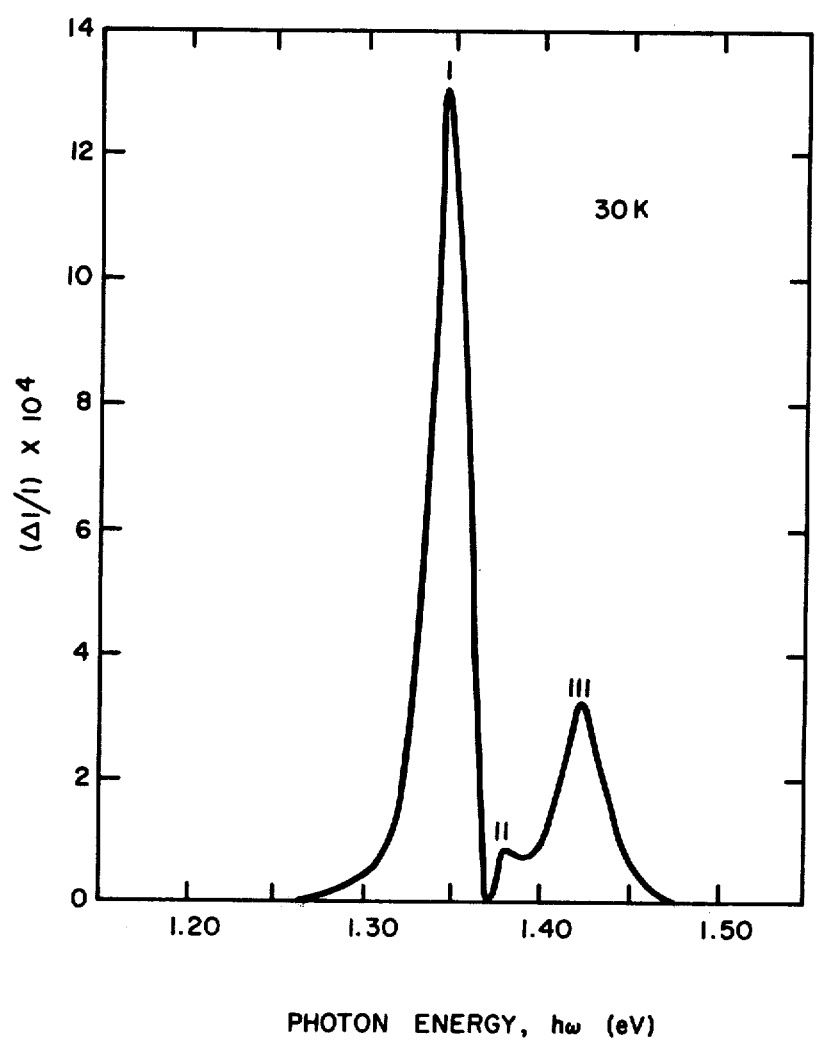
FIG. 4 is a graph similar to that of FIG. 3 except it is performed at a different temperature.

FIG. 3 is a graph of the modulated change in intensity and relative percent of transmittance vs photon energy in a two layered structure. The solid line is matching photon energy to changes in intensity. The dashed line compares photon energy with relative percent of transmittance. As can be seen, when the photon energy reaches approximately 1.4 electron volts the effective transmittance drops to zero implying total absorption. Below 1.2 electron volts the effective transmission is 100%, implying that the semiconductor is transparent to such wavelengths. FIG. 3 is a graph of measurements run at approximately room temperature, 300° K. The graph shows three peaks, 1, 2, and 3, with peak 1 negative and peaks 2 and 3 positive. FIG. 4 shows a graph of the same field modulated intensity vs photon energy but run at a low temperature of 30° K. Once again peaks 1, 2, and 3 can be determined. The peaks are shifted in energy appropriate to the change in temperature, but now peak 1 is positive as well as peaks 2 and 3. It should be noted that the energy separation of peaks 1 and 3 is the same in both figures and corresponds to the gap energies of the two adjoining layers in an actual experiment with a known semiconductor. The change in polarity with temperature of peak 1 with respect to peak 2 is a direct confirmation of the presence of interface states produced by lattice mismatch between adjacent layers. See "Internal Electroabsorption in Inverted Heterostructures, An Optical Method of Probing Epitaxial Layers" by N. Bottka and M. E. Hills, Appl. Phys. Lett. 33 (8), 765 (1978).

What is claimed is:

1. An apparatus for measuring lattice match between layers of a multi-layer semiconductor epitaxially grown on a substrate comprising:
    a tunable source of monochromatic light for illuminating said semiconductor from the substrate side such that said light is transmitted through said semiconductor;
    an electrode in electrical contact with the bottom surface of said substrate for applying a voltage across said semiconductor;
    a Schottky barrier contact on the top surface of the uppermost layer of said multilayer semiconductor for applying voltage across said semiconductor, said Schottky barrier contact of sufficient area to reflect light transmitted into said semiconductor through said substrate;
    a variable voltage source connected to said electrode and said Schottky barrier contact for varying the voltage in a predetermined manner across said semiconductor;
    a detector with an output, said detector positioned to receive said incident monochromatic light after it is reflected from said semiconductor for measuring said reflected light;
    means for amplifying said detector output to a predetermined level connected to said detector output; and
    means for recording said amplified detector output as a function of said varied voltage connected to said amplification means.

2. The apparatus of claim 1 wherein said substrate is GaAs.

3. The apparatus of claim 1 wherein said epitaxial layers consist of $GaAs_{1-x}Sb_x$ such that each succeeding layer interface above said substrate has a lower energy potential than the previous layer interface above said substrate.

4. An apparatus as described in claim 3 where said variable voltage source further comprises means for applying a changing D.C. bias voltage which is switched on and off at a predetermined frequency rate.

5. An apparatus as described in claim 4 where amplifying means comprises a lock-in amplifier connected to said frequency modulated source for use as a reference.

6. An apparatus as described in claim 1 where said variable voltage source further comprises means for applying a changing D.C. bias voltage which is switched on and off at a predetermined frequency.

7. An apparatus as described in claim 6 wherein said amplifying means comprises a lock-in amplifier connected to said frequency modulated voltage source for use as a reference.

8. An apparatus as described in claim 1 wherein said amplifying means comprises a lock-in amplifier connected to said variable voltage source for use as a reference.

9. An apparatus as described in claim 1 further comprising an antireflection coating on the bottom surface of said substrate.

10. A method for determining material parameters in a multilayer semiconductor with a substrate comprising the steps of:
    placing an electrode on said substrate and a Schottky barrier contact on the uppermost layer of said multilayer semiconductor for maintaining a voltage across said semiconductor;
    connecting a variable voltage source to said Schottky barrier contact and said electrode for creating said voltage across said semiconductor such that it changes in a predetermined manner;
    shining monochromatic light into said semiconductor from the substrate side for reflection from said semiconductor;
    detecting said reflected light intensity from said semiconductor; and
    comparing said detected reflected light intensity with said varied voltage.

11. The method of claim 10 further comprising the step of varying the composition of each layer above said substrate such that each layer interface has a lower energy potential than the previous layer interface above said substrate.

12. A spectrum analyzer of a broadband light beam comprising:

- a multilayered semiconductor with a substrate and a plurality of layers such that each interface between layers has a unique energy potential, said semiconductor placed so said light beam is incident on said substrate and transmitted through said substrate and layers;
- electrodes placed on the bottom of said substrate and on the top of said uppermost layer for supporting a voltage potential across said semiconductor, said electrode on the uppermost layer designed to serve as a Schottky barrier contact and positioned on said uppermost layer to reflect said incident light back through said semiconductor;
- a variable voltage source electrically connected to said electrodes for creating a voltage across said semiconductor which varies in a predetermined manner;
- a light detector positioned to receive light from said broadband light beam after it has been reflected from said Schottky barrier contact; and
- a recorder connected to said detector and said voltage source for recording the changes in reflected light as a function of voltage.

13. A spectrum analyzer as described in claim 12 further comprising an antireflection coating on the bottom of said substrate for increasing the amount of light transmitted into said semiconductor.

14. A spectrum analyzer as described in claim 13 wherein said substrate is made of N+ GaAs and said layers consist of N-type GaAs$_{1-x}$Sb$_x$.

15. A spectrum analyzer as described in claim 12 wherein (18) said substrate is made of N+ GaAs and said layers consist (19) of N-type GaAs$_{1-x}$Sb.

16. A spectrum analyzer of a broadband light beam as described in claim 12 wherein said substrate consists of GaAs.

17. A spectrum analyzer of a broadband light beam as described in claim 16 wherein said plurality of layers consist of GaAs$_{1-x}$Sb$_x$ such that each succeeding layer interface above said substrate has a lower energy potential than the previous layer interface above said substrate.

18. A spectrum analyzer of a broadband light beam as described in claim 12 wherein said variable voltage source further comprises means for applying a changing D.C. bias voltage which is switched on and off at a predetermined frequency.

19. A method of analyzing broadband light to evaluate its spectrum content comprising the steps of:

- intercepting said light with a multilayered semiconductor, where said layers are epitaxially grown on a substrate, said semiconductor oriented such that said light is incident on said substrate and transmitted through said semiconductor;
- reflecting said light back through said semiconductor by means of a Schottky barrier contact on the top surface of the top layer of said multilayers;
- varying a D.C. voltage bias across said semiconductor in a predetermined manner such that for different voltage levels unique light frequencies are absorbed by said semiconductor;
- detecting said reflected light so as to measure the intensity of said reflected light; and
- comparing said reflected light intensity with said varied voltage to identify said absorbed frequencies.

20. An apparatus for measuring lattice match between layers of a multilayer semiconductor epitaxially grown on a substrate comprising:

- a tunable source of monochromatic light for illuminating said semiconductor from the substrate side such that said light is transmitted through said semiconductor;
- an electrode in electrical contact with the bottom surface of said substrate for applying a voltage across said semiconductor;
- a Schottky barrier contact on the top surface of the uppermost layer of said multilayer semiconductor for applying voltage across said semiconductor, said Schottky barrier contact of sufficient area to reflect light transmitted through said semiconductor back through said semiconductor;
- a variable voltage source for applying D.C. bias voltage across said semiconductor in a predetermined manner, said changing voltage switched on and off at a predetermined rate;
- a detector with an output positioned to receive said reflected light for measuring the intensity of said reflected light;
- a lock-in amplifier connected to said detector output and said variable voltage source for selectively enhancing the measured reflected light intensity as a function of the applied voltage; and
- an X-Y recorder connected to said lock-in amplifier for charting the correlation between said reflected light intensity and said varied voltage.

* * * * *